United States Patent [19]
Kubota et al.

[11] Patent Number: 5,342,826
[45] Date of Patent: Aug. 30, 1994

[54] BI-SR-CA-CU-O SUPERCONDUCTING THIN FILM

[75] Inventors: Nobuhiko Kubota; Tsunemi Sugimoto; Kazushi Sugawara; Yuh Shiohara, all of Tokyo, Japan

[73] Assignees: International Superconductivity Technology center; Ishikawajima-Harima Heavy Industries Co., Ltd.; Sharp Corporation, all of Japan

[21] Appl. No.: 950,127

[22] Filed: Sep. 24, 1992

[30] Foreign Application Priority Data

Oct. 2, 1991 [JP] Japan .................. 3-255206
Dec. 2, 1991 [JP] Japan .................. 3-317858
Feb. 18, 1992 [JP] Japan .................. 4-030672
Jun. 29, 1992 [JP] Japan .................. 4-170556

[51] Int. Cl.$^5$ .................. B32B 9/00
[52] U.S. Cl. .................. 505/238; 505/701; 428/688; 428/689; 428/699; 428/700; 428/701
[58] Field of Search .................. 505/701, 702, 703, 704; 428/688, 689, 209, 210, 930

[56] References Cited

U.S. PATENT DOCUMENTS 5,151,408  9/1992  Tanaka .................. 505/1

OTHER PUBLICATIONS

Sugimoto et al, Appl. Phys. Lett 60(11) 16 Mar. 1992, pp. 1387-1389.
"Superconductors' Material Problems", Science vol. 240 pp. 25-27.
Ishibashi et al. Jpn. J. Appl. Phys. vol. 32 (1993) pp. L257-L259, part 2 No. 2B Feb. 15, 1993.
Japanese Journal of Applied Physics vol. 30, No. 6A, Jun. 1991, Tokyo, JP pp. L1006-L1008 Ishizuka Y. et al.
Physica C, vol. 185, pt. 3, Dec. 1, 1991, pp. 2009-2010, Amsterdam, NL; Miura T. et al & Conference on High Temperature Superconductors, Jul. 22, 1991 Kanazawa, JP.
Japanese Journal of Applied Physics vol. 29, No. 10, Oct. 1990, Tokyo, JP pp. L1816-1818 Kuroda K. et al. Superconducting thin films of Y-Ba-Cu-O prepared by metalorganic chemical vapor deposition J. Appl. Phys. 67 (3), 1 Feb. 1990.
Vacuum deposition of multilayer Bi-Ca-Sr-Cu-O superconducting thin films Appl. Phys. Lett. 53(7), 15 Aug. 1988.

*Primary Examiner*—Patrick J. Ryan
*Assistant Examiner*—Patrick Jewik
*Attorney, Agent, or Firm*—Kanesaka & Takeuchi

[57] ABSTRACT

A Bi-Sr-Ca-Cu-O system superconducting thin film formed on a substrate comprising [110] single crystals of an $ABO_3$ type oxide having a perovskite structure, in which a (119) face is selectively grown relative to a substrate surface. The film is formed on the substrate by chemical vapor deposition process. A method of manufacturing a BiSrCaCuO system superconducting film in which an a-axis is oriented preferentially relative to the surface of a substrate comprising MgO (100) single crystals, wherein the chemical composition ratio (Sr+Ca+Cu)/Bi of the BiSrCaCuO system superconducting film is made not less than 3.5. A Bi-Sr-Ca-Cu-O system superconducting thin film formed on a substrate comprising MgO [110] single crystals, in which a (110) face is selectively grown to the substrate surface. The film is formed on the substrate by a chemical vapor deposition process.

4 Claims, 16 Drawing Sheets 1.0 μm 1.0 μm

BI-SR-CA-CU-O SUPERCONDUCTING THIN FILM

FIELD OF THE INVENTION

The present invention concerns a Bi-Sr-Ca-Cu-O system superconducting film and a manufacturing method thereof and, more specifically, it relates to a Bi-Sr-Ca-Cu-O system superconducting film which is extremely effective for a Josephson junction device, three terminal device or the like, as well as a manufacturing method thereof.

DESCRIPTION OF THE RELATED ART

Oxide superconducting thin films show high superconducting critical temperature (Tc) and application of them to electronic devices such as transistors and Josephson junction devices has been expected. In a case of utilizing the oxide high temperature superconductors to various kinds of such devices, it requires a structure in which superconductor/insulator/superconductor are successively laminated on a substrate. Generally, in a case of manufacturing a laminate structure device such as a Josephson junction device or a three terminal device, it has been known that the manufacture of the device is facilitated as the coherence length ($\zeta$), which is one of superconducting physical properties, is greater. That is, it is advantageous view of the characteristic of the resultant device to provide a device of a structure in which electric current can be caused to flow on ab crystal face of long coherence length and, for this purpose, it is important that the film is oriented along the a-axis or the b-axis relative to the substrate surface.

By the way, as a method of manufacturing oxide system superconducting thin films, there has been known a physical vapor deposition method such as sputtering (PVD) and a chemical vapor deposition process (CVD). Among them, in the PVD process, the lower limit for a deposition rate is comparatively greater than the lower limit in the CVD process and, if the deposition rate is lowered in the PVD process, the deposition rate and the composition of the formed film are not defined and it is difficult to obtain a thin film of high quality which can be considered to be manufactured at a low deposition rate (refer to Applied Physics Letters, 1988, vol. 53, No. 7, p 624).

Generally, in the CVD process, saturated steams of starting compounds can be maintained stably within a certain temperature range. Further, the steams and an oxidizing gas are separated from each other before they react on a substrate to form a film, required reaction can be taken place only on the substrate (Journal of Applied Physics, 1990, vol. 67, No. 3, p 1562). In this point, the CVD process is excellent over the PVD process in which control for the reaction between the starting gas and the oxidizing gas is difficult and the steam concentration of the starting material gas itself in the system is instable. Further, the CVD process, as compared with the PVD process, has various merits in view of the cost required for the manufacturing apparatus, easy for the scale up and high through put.

In view of the above, it is industrially advantageous to manufacture the oxide system superconducting thin films by means of the CVD process.

As has been described above, in a case of utilizing the oxide system superconducting thin films to various kinds of devices, orientation of the film relative to a substrate surface is desirably along the a- or b-axis or orientation similar thereof. However, since the oxide system superconducting thin film is liable to be oriented along the c-axis in view of its large anisotropy of the crystal structure and, in particular, the Bi-Sr-Ca-Cu-O system superconducting thin film tends to be oriented along the c-axis. That is, because of the large anisotropy of the high temperature oxide superconductor, the coherence length of the high temperature oxide superconductor has a property of longer in the direction of a-, b-axis and shorter in the direction of c-axis. This has resulted in a significant problem for the improvement of the characteristics of a device made into a laminate structure by using the c-axis orientation film. Accordingly, it has been desired for the high temperature oxide superconducting thin film oriented such that the superconducting current caused to flow to a device of the laminate structure flows in the direction of a- or b-axis of a large coherence length.

Then, in the prior art, there has been an example of Forming a Bi-Sr-Ca-Cu-O system superconducting thin film preferentially oriented along the a- or b-axis by sputtering, or an example of forming a Bi-Sr-Ca-Cu-O system superconducting thin film in which a (119) face or a (117) face is preferentially oriented by means of sputtering or vapor deposition, but the c-axis orientation ingredients are incorporated together in both of them, which can not be a complete orientation film. Further, also in view of Tc, crystallinity or the like, they can not have characteristics suitable to the device. Further, there has been reported an example of forming a YBaCuO system superconducting thin film which is preferentially grown along the a-axis by the CVD process, but a BiSrCaCuO system superconducting film oriented along the a-axis by the CVD process has not yet been provided.

In view of the above, it has been demanded for a thin film of excellent characteristics such as Tc and crystallinity and selectively oriented along the a-axis or b-axis, or a thin film oriented selectively along a (119), (117) or (110) face or along the a-axis by the CVD process, as well as a manufacturing technique therefor.

OBJECT AND SUMMARY OF THE INVENTION

The present invention has been accomplished in view of the foregoing situations in the prior art and it is an object thereof to provide a Bi-Sr-Ca-Cu-O system superconducting thin film suitable to the manufacture of a Josephson junction device, 3-terminal device or the like, in which a (119) face is selectively oriented relative to a substrate surface and excellent in the characteristics such as Tc and crystallinity, as well as a manufacturing method therefor.

Another object of the present invention is to provide a BiSrCaCuO system superconducting film which is suitable to the manufacture of a Josephson device, three-terminal device or the like and which is oriented along the a-axis relative to the substrate surface.

A further object of the present invention is to provide a method of manufacturing a BiSrCaCuO system superconducting film oriented along the a-axis not depending on the composition, by forming nuclei preferentially oriented along the a-axis in the initial stage of forming the film.

A further object of the present invention is to provide a Bi-Sr-Ca-Cu-O system superconducting thin film which is suitable to the manufacture of a Josephson junction device, three-terminal device or the like, in which a (110) face is selectively oriented relative to the substrate surface and which is excellent in characteristics such as Tc and crystallinity, as well as a manufacturing method therefor.

A Bi-Sr-Ca-Cu-O system superconducting thin film according to the first aspect of the present invention, is a Bi-Sr-Ca-Cu-O system superconducting thin film formed on a substrate comprising a []10] single crystals of $ABO_3$ type oxide having a perovskite structure, in which a (119) face is selectively grown relative to the substrate surface.

A method of manufacturing a Bi-Sr-Ca-Cu-O system superconducting thin film according to the second aspect of the present invention resides in selectively growing a (119) face by means of a chemical vapor deposition process to a surface of a substrate comprising [110] single crystals of an $ABO_3$ type oxide having a perovskite structure.

By using the substrate comprising [110] single crystals of the $ABO_3$ type oxide having the perovskite structure, a Bi-Sr-Ca-Cu-O system superconducting thin film in which the (119) face is selectively grown relative to the substrate surface can be obtained easily by the CVD process.

In particular, according to the invention a Bi-Sr-Ca-Cu-O system superconducting thin film of higher quality can be obtained.

A method of manufacturing a Bi-Sr-Ca-Cu-O system superconducting film according to the third aspect of the present invention is a method of manufacturing a Bi-Sr-Ca-Cu-O system superconducting film in which the a-axis is oriented preferentially relative to the surface of a substrate comprising MgO (100) single crystals, wherein the chemical composition ratio (Sr+Ca+Cu)/Bi of the BiSrCaCuO system superconducting film is not less than 3.5.

In a method of manufacturing a BiSrCaCuO system superconducting film according to the fourth aspect of the present invention wherein the chemical composition ratio (Sr+Ca+Cu)/Bi of the film is made not less than 3.5 at least in the initial stage of film formation.

If the temperature of the MgO (100) substrate, that is, the film forming temperature exceeds 780° C., a BiSrCaCuO system superconducting film in which the a-axis is oriented preferentially relative to the substrate surface could not be obtained. On the other hand, the present inventors have found that a BiSrCaCuO system superconducting film in which the a-axis is oriented preferentially relative to the substrate surface can be obtained even if the film Forming temperature exceeds 780° C. under such a Film Forming condition that the chemical composition ratio (Sr+Ca+Cu)/Bi of the film is not less than 3.5.

Accordingly, the BiSrCaCuO system superconducting film oriented along the a-axis relative to the substrate surface can be obtained easily by the CVD process, for example, by using MgO (100) single crystals as a substrate, at a chemical composition ratio (Sr+Ca+-Cu)/Bi of the film of not less than 3.5, at a film-forming temperature of higher than 780° C. and at a deposition rate of greater than 1.0 nm/min.

In particular, a BiSrCaCuO system superconducting film oriented along the a-axis not depending on the composition can be obtained by forming a film so as to provide the above-mentioned composition ratio and forming nuclei oriented preferentially along the a-axis in the initial stage of the film formation.

A Bi-Sr-Ca-Cu-O system superconducting thin film according to the fifth aspect of the present invention is a Bi-Sr-Ca-Cu-O system superconducting thin film formed by chemical vapor deposition process to a substrate comprising MgO [110] single crystals in which a (110) face is selectively grown to the substrate surface.

A method of manufacturing a Bi-Sr-Ca-Cu-O system superconducting thin film according to the sixth aspect of the present invention resides in forming a Bi-Sr-Ca-Cu-O system superconducting thin film by a chemical vapor deposition process to a substrate comprising MgO [110] single crystals, in which a (110) face is selectively grown relative to the substrate surface.

By using the substrate comprising MgO [110] single crystals, a Bi-Sr-Ca-Cu-O system superconducting thin film in which a (110) face is selectively grown relative to the substrate surface can be obtained easily by a CVD process.

In particular, the orientation degree for the (110) Face can be improved further by forming nuclei at the initial stage of the film formation by the CVD process.

DESCRIPTION OF THE PREFERRED EMBODIMENTS

Figure 1:
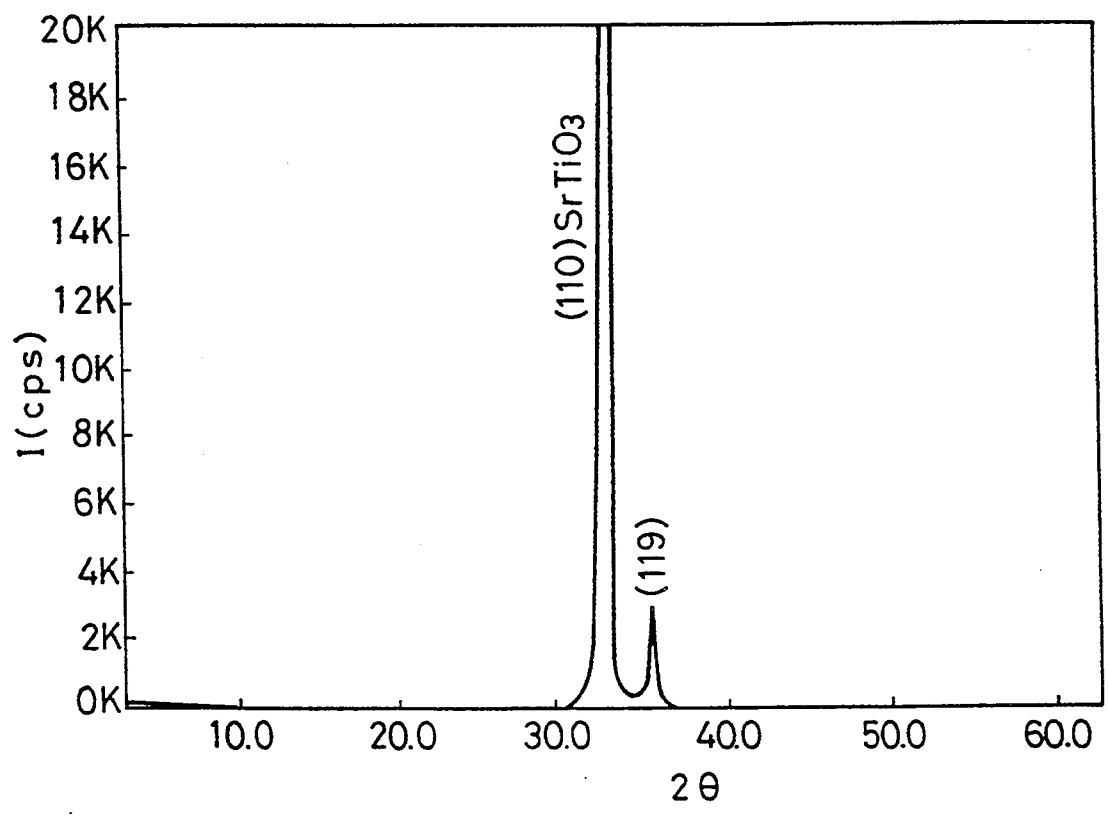
FIG. 1 is a XRD spectral diagram for a Bi-Sr-Ca-Cu-O system superconducting thin film obtained in Example 1.

The present invention will now be described more in details.

As the Bi-Sr-Ca-Cu-O system superconductor constituting the Bi-Sr-Ca-Cu-O system superconducting film according to the present invention, there can be mentioned, For example, those having a chemical composition:

$$Bi_8Sr_2Ca_1Cu_2O_x$$

$$Bi_2Sr_2Ca_2Cu_3O_y$$

Further, Pb may be incorporated partially to the above-mentioned composition in order to improve Tc (critical temperature).

Then, the Bi-Sr-Ca-Cu-O system superconducting film according to the first and the second features of the present invention can be formed on a single crystal substrate of a perovskite structure oxide (ABO3 type) of face indices [110], by means of a chemical vapor phase deposition process (CVD process).

As the substrate of the perovskite structure used in the first and the second aspects of the present invention. $SrTiO_3$, $NdGaO_3$, $LEAlO_3$, $YAlO_3$ or the like is suitable to the manufacture of a thin film at high quality. For obtaining a thin film of higher quality, it is desirable that the crystal face is inclined by from 2° to 10° from (110 to $<1\bar{1}0>$.

Description will now be made to a method of manufacturing the Bi-Sr-Ca-Cu-O system superconducting thin film according to the second aspect off the present invention.

The Bi-Sr-Ca-Cu-O system superconducting thin film according to the first aspect of the present invention manufactured by using each of starting material gases, a carrier gas and an oxidizing gas in accordance with the chemical composition and by means of a CVD process of depositing a thin film on [110] single crystals of the $ABO_3$ type oxide having the perovskite structure as described above.

As the starting material gas used in the present invention, there can be mentioned various metalorganic complex compounds containing, for example, Bi, St, Ca or Cu.

As the organic portion of the metalorganic complex, that is, ligand of a complex, there can be mentioned acetylacetone (hereinafter simply referred to as "acac", dipivaloylmethane (hereinafter simply referred to as "DPM"), cyclopentadiene, as well as those compounds represented by the following structural formula:

$$R-CO-CH_2-CO-C(CH_3)_3$$

where R represents a fluorinated lower alkyl group with to 4 carbon atoms.

In the case of using the ligand described above, is extremely advantageous for the preparation of a starting material gas since the synthesis and the isolation of the metal complex are easy. Further, since the vapor pressure of the metalorganic complex per se is relatively high, it is most suitable to the starting material gas for CVD. In addition, as the ligand, there can be also used a phenyl group (hereinafter simply referred to as "ph"), alkyl group such as methyl group (hereinafter simply referred to as "Me"), ethyl group (hereinafter simply referred to as "Et") and an aryl group. Further, the fluorinated lower alkyl group represented by R in the structural formula described above is, specifically, trifluoromethyl group, pentafluoroethyl group (hereinafter simply referred to as "PPM") and heptafluoropropyl group.

As specific metalorganic salts used as the starting material gas, there can be mentioned the followings.

$Bi(ph)_3$, $Bi(DPM)_3$
$BiMe_3$, $BiEt_3$. Bi alcoholate,
$Sr(DPM)_2$, $Sr(PPM)_2$,
$Ca(DPM)_2$, $Ca(PPN)_2$,
$Cu(DPM)_2$, $Cu(PPM)_2$, $Cu(acac)_2$.

As the carrier gas used for supplying the starting material gas into a reactor in the present invention, there can be mentioned, for example, an inert gas such as Ar, He and Ne, as well as $N_2$.

Further, as the oxidizing gas used in the present invention, there can be mentioned, for example. $O_2$, $O_3$, Air, $N_2O$, NO and $NO_2$. Further, for improving the oxidizing power it is possible to use a laser beam, a visible ray or UV-ray from a lamp as a light source in combination or to make the oxidizing gas into plasmas. The partial pressure of the oxidizing gas in the total gas is preferably From 0.01 to 760 tort, particularly, From 1 to 100 torr.

The film Forming temperature is preferably from 300 to 900° C. and, more particularly, from 600 to 820° C. in view of the improvement for the Tc and the crystallinity. If the film forming temperature is lower than 300° C., decomposition of the starting material gas is difficult. On the other hand, if it exceeds 900° C., it is not preferred since melting of the thin film occurs to result in the deterioration of the quality of the thin film. There is no particular restriction on the deposition rate but it preferably from 100 to 0.1 nm/min.

The film thickness of the Bi-Sr-Ca-Cu-O system superconducting film according to the first aspect of the present invention thus obtained is preferably from about 10 to 1000 nm in a usual case.

The Bi-Sr-Ca-Cu-O system superconducting film according to the first aspect of the present invention is a high performance superconductor usually having a Tc of 50 to 100 K and it is extremely useful to various kinds of devices since the (119) face is selectively grown relative to the substrate surface.

In the Bi-Sr-Ca-Cu-O system superconducting film according to the first and the second aspects of the present invention, as well as a manufacturing method thereof, Bi-Sr-Ca-Cu-O system superconductor in which (119) face is selectively grown relative to the substrate surface and which is used as a material for various kinds of devices is provided by a CVD process, which is industrially advantageous as a method of forming an oxide system superconducting film.

In particular, according to the invention a Bi-Sr-Ca-Cu-O system superconducting thin film of higher quality can be obtained.

In the third and the fourth aspects of-the present invention, the BiSrCaCuO system superconducting film as described above can be formed preferably by a chemical vapor deposition process (CVD process) on a MgO single crystal substrate of face indices [100].

Description will now be made to a method of manufacturing a BiSrCaCuO system superconducting film according to the fourth aspect of the present invention by the CVD process.

In the third and fourth aspects of the present invention, a BiSrCaCuO system superconducting film is manufactured by using each of starting material gases, a carrier gas and an oxidizing gas in accordance with the chemical composition of the BiSrCaCuO system superconducting film to be manufactured, by means of a CVD process of depositing to form a thin film on a MgO (100) single crystal substrate. In this case, the chemical composition of the film can be formed into a desired composition easily, for example, by controlling the vaporization temperature of the starting material and the flow rate of the carrier gas.

As the starting material gas, the carrier gas and the oxidizing gas used in the third and the fourth aspect of the present invention, the same gases as those used in the first and the second aspects of the present invention can be used.

In the fourth aspect of the present invention, the chemical composition ratio (Sr+Ca+Cu)/Bi of the film is made not less than 3.5 upon Forming the BiSrCaCuO system superconducting film. With such a chemical composition, a BiSrCaCuO system superconducting film in which the a-axis is preferentially oriented can be obtained even when the temperature of the MgO (100) single crystal substrate, that is, the film forming temperature exceeds 780° C. As described above, the chemical composition of the film can be controlled easily by controlling the evaporation temperature of the starting material and the flow rate of the carrier gas and it is preferred to set the chemical composition ratio (Sr+Ca+Cu)/Bi of the film to not less than 3.5 at the initial stage of the film formation.

Further, the deposition rate is preferably not less than 1.0 rim/min. If the deposition rate is less than 1.0 nm/min, it is difficult to obtain a BiSrCaCuO system superconducting film in which the a-axis is preferentially oriented relative to the substrate surface.

In the third and the fourth aspects of the present invention, it is particularly preferred to form the film at a film forming temperature of 780° to 850° C., at a deposition rate of 1.0–2.0 nm/min and with the chemical composition ratio (Sr+Ca+Cu)/Bi of the film of not less than 3.5 and not more than 4.5.

The thickness of the BiSrCaCuO system superconducting film obtained in this way is preferably made to about ]100–1000 nm in a usual case.

The BiSrCaCuO system superconducting film manufactured by the method of the fourth aspect of the present invention is a high performance superconductor generally with 50–100 K of Tc, in which the a-axis is preferentially grown relative to the substrate surface and, accordingly, it is extremely useful for various kinds of devices.

In the method of manufacturing the BiSrCaCuO system superconducting film according to the third and the fourth aspects of the present invention, a BiSrCaCuO system which is preferentially grown along the a-axis relative to the substrate surface and useful as a material for various kinds of devices can be provided by a CVD process which is industrially advantageous as a method of forming an oxide system superconducting film.

In particular, BiSrCaCuO system superconducting film which is oriented along the a-axis not depending on the composition can be manufactured by forming nuclei oriented preferentially along the a-axis in the initial stage of the film formation and it has an extremely great industrial usefulness.

In the fifth and sixth aspects of the present invention, as the Bi-Sr-Ca-Cu-O system superconductor constituting the Bi-Sr-Ca-Cu-O system superconducting film, there can be mentioned, in the same manner as described above, for example, those having the chemical compositions:

$Bi_2Sr_2Ca_1Cu_2O_x$ $Bi_2Sr_2Ca_2Cu_3O_y$

Particularly, for increasing the degree of (110) orientation, it is preferred to slightly decrease the amount of Bi in the composition described above, for example, to a range:

$Bi_{1.7-2.0}Sr_2Ca_1Cu_2O_x$ in which Bi ranges from 1.7 to 2.0. Further, in order to improve the Tc (critical temperature), Pb may be incorporated further as a portion of the composition.

Then, the Bi-Sr-Ca-Cu-O system superconducting film according to the fifth aspect of the present invention is formed by a chemical vapor deposition process (CVD process) on a single crystal substrate of MgO of face indices [110].

Description will now be made to the method of manufacturing the Bi-Sr-Ca-Cu-O system superconducting thin film according to the sixth aspect of the present invention.

The Bi-Sr-Ca-Cu-O system superconducting thin film according to the sixth aspect of the present invention is prepared by using each of starting material gases, a carrier gas and an oxidizing gas in accordance with the chemical composition by a CVD method of depositing a thin film on MgO [110] single crystals.

As the starting material gases, the carrier gas and the oxidizing gas used in the fifth and sixth aspects of the present invention, the same gases as those used in the first and the second aspects of the present invention can be used.

The film forming temperature is preferably from 300° to 900° C. If the film forming temperature is lower than 300° C., it is difficult to decompose the starting material gas. On the other hand, if it exceeds 900° C., since melting of the thin film occurs, it undesirably deteriorates the quality of the thin film. In view of the characteristics of the resultant film, the film forming temperature is particularly preferably from 600° to 820° C. since it does not show the superconducting characteristics at the film forming temperature of lower than 600° C., whereas the orientation control is difficult if the temperature is higher than 820° C.

There is no particular restriction on the deposition rate but it is preferably from 0.1 to 100 nm/min.

In the fifth and sixth aspects of the present invention, the degree of orientation for the (110) face relative to the substrate surface of the Bi-Sr-Ca-Cu-O system superconducting thin film formed can be improved further by forming nuclei in the initial stage of film formation by the CVD process.

The nuclei formation can be conducted in the initial stage of the film formation by the CVD process by forming a quaternary Sr-Ca-Cu-O thin film comprising constituent elements of Bi-Sr-Ca-Cu-O system superconducting thin film, from which Bi is removed to an average film thickness of not more than 20 Å, preferably, about 10 to 20 Å.

The thickness of the Bi-Sr-Ca-Cu-O system superconducting film of the fifth aspect according to the present invention obtained in this way is preferably from 100 to 10,000 Å in a usual case.

The Bi-Sr-Ca-Cu-O system superconducting film of the fifth aspect according to the present invention is a high performance superconductor generally having 50 to 100 K of Tc, in which the (110) face is selectively grown relative to the substrate surface and, accordingly, it is extremely useful for various kinds of devices.

In the Bi-Sr-Ca-Cu-O system superconducting film according to the fifth and the sixth aspects of the present invention, as well as a manufacturing method thereof, a Bi-Sr-Ca-Cu-O system superconducting film which is useful as a material for various kinds of devices and selectively grown at (110) face relative to the substrate surface can be provided by a CVD process which is industrially useful as a method of forming an oxide system superconducting thin film.

In particular, by forming nuclei in the initial stage of film formation by the CVD process, the degree of the (110) face orientation can be improved further.

The present invention will now be described more specifically referring to examples and comparative examples. The gas flow rate is indicated by sccm, which is a value obtained by converting cc/min into that at 1 arm and 25° C.

EXAMPLE 1

A Bi-Sr-Ca-Cu-O system superconducting film was manufactured by using the starting material gases shown in the following Table 1 and using the substrate and under the Film forming conditions shown in Table 2.

TABLE 1

| Starting material gas | Temperature and flow rate* |
| --- | --- |
| Bi(ph)$_3$ | 87° C., 50 sccm |
| Sr(DPM)$_2$ | 215° C., 50 sccm |
| Ca(DPM)$_2$ | 183° C., 50 sccm |
| Cu(DPM)$_2$ | 102° C., 50 sccm |

*Temperature and flow rate when evaporated starting material gases are caused to flow together with Ar as the carrier gas into the reactor

TABLE 2

| | |
| --- | --- |
| Oxidizing gas | O$_2$ |
| Substrate | SrTiO$_3$ single crystal (face indices [110]) |
| Substrate temperature | 775° C. |
| Total pressure (starting gas + Ar + O$_2$) | 10 torr |
| O$_2$ partial pressure | about 9 torr |
| O$_2$ flow rate | 1200 sccm |
| Deposition rate | about 0.5 nm/min |

As a result, a film of about 1900 Å (190 nm) could be formed by the film formation for about 6 hours. Physical properties of the resultant Bi-Sr-Ca-Cu-O system superconducting film were as shown below.

Chemical composition: Bi$_2$Sr$_2$Ca$_1$Cu$_2$O$_x$
Critical temperature (Tc) : about 63 K
XRD spectral : as shown in FIG. 1, only the peak corresponding to the face indices of (119)

Figure 2:
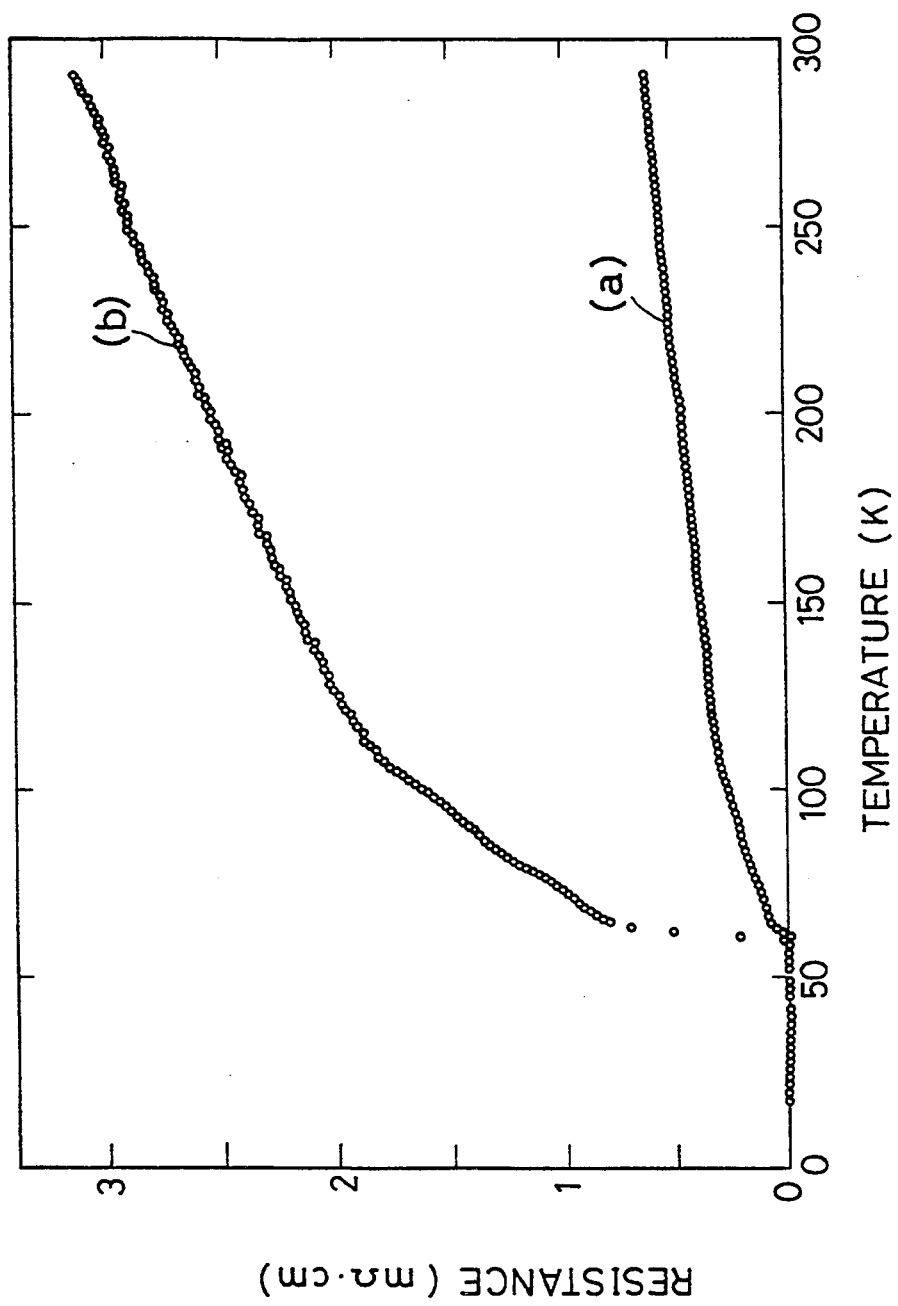
FIG. 2 is a graph illustrating resistance-temperature characteristics obtained in Example 1.

FIG. 2 shows resistance-temperature characteristics of the resultant Bi-Sr-Ca-Cu-O system superconducting thin film. In the figure, (a) shows a case of flowing an electric current in the <100> direction, while (b) shows a case of flowing a current in the <1$\bar{1}$0> direction and it can be soon that To is about 63 K in either of the cases. In addition, since it is selectively oriented to the (119) face, if the flowing direction of the current ((a) and (b)) changes, a difference of about five times in the electric resistance is recognized in the normal conductive state.

Figure 3:
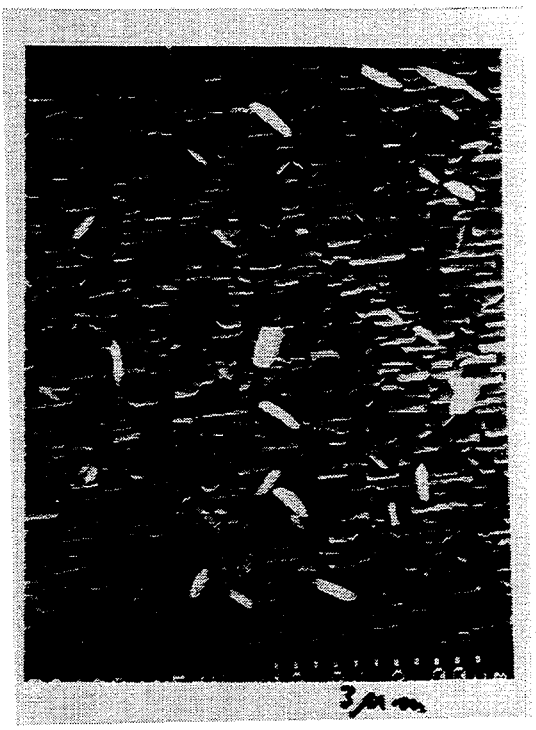
FIG. 3 is an electron microscopic photograph (30,000 ×) illustrating the crystal structure of the Bi-Sr-Ca-Cu-O system superconducting thin film obtained in Example 1.

FIG. 3 shows a scanning type electron microscopic photograph for the surface of the resultant Bi-Sr-Ca-Cu-O system superconducting thin film. Only plate-like crystal grains inclined by about 48° were observed and it can be seen that they are selectively oriented at (119).

EXAMPLE 2

Figure 4:
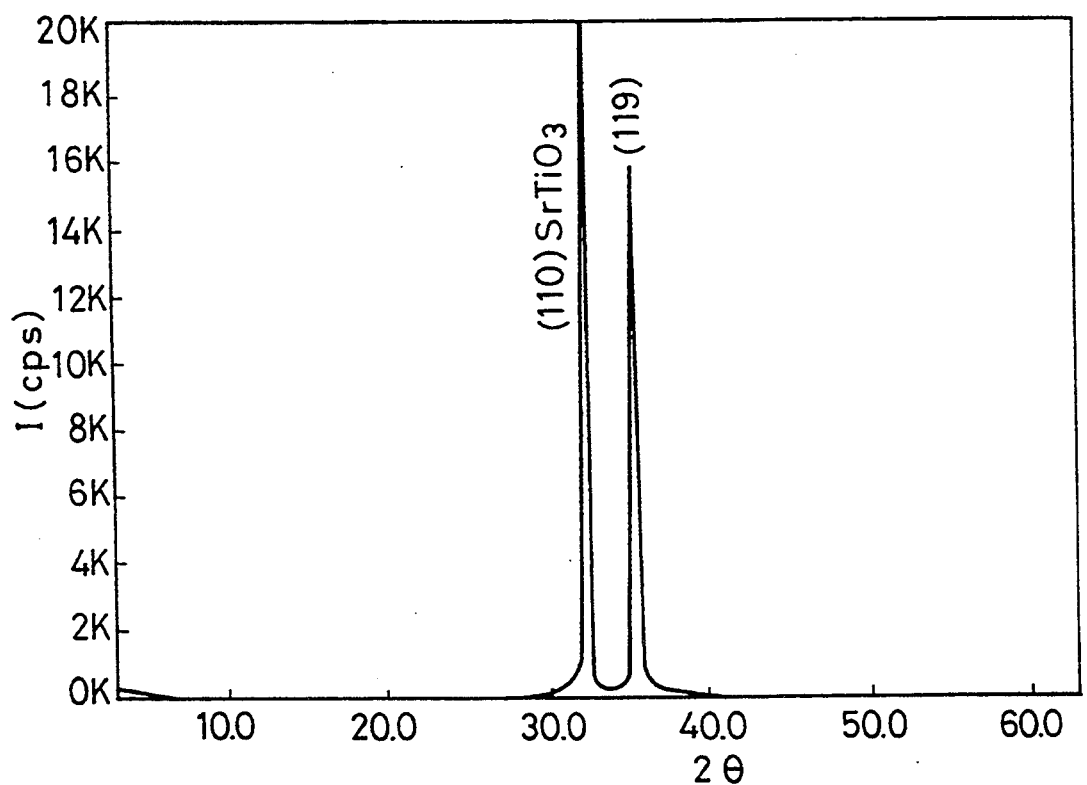
FIG. 4 is a XRD spectral diagram for a Bi-Sr-Ca-Cu-O system superconducting thin film obtained in Example 2.
Figure 5:
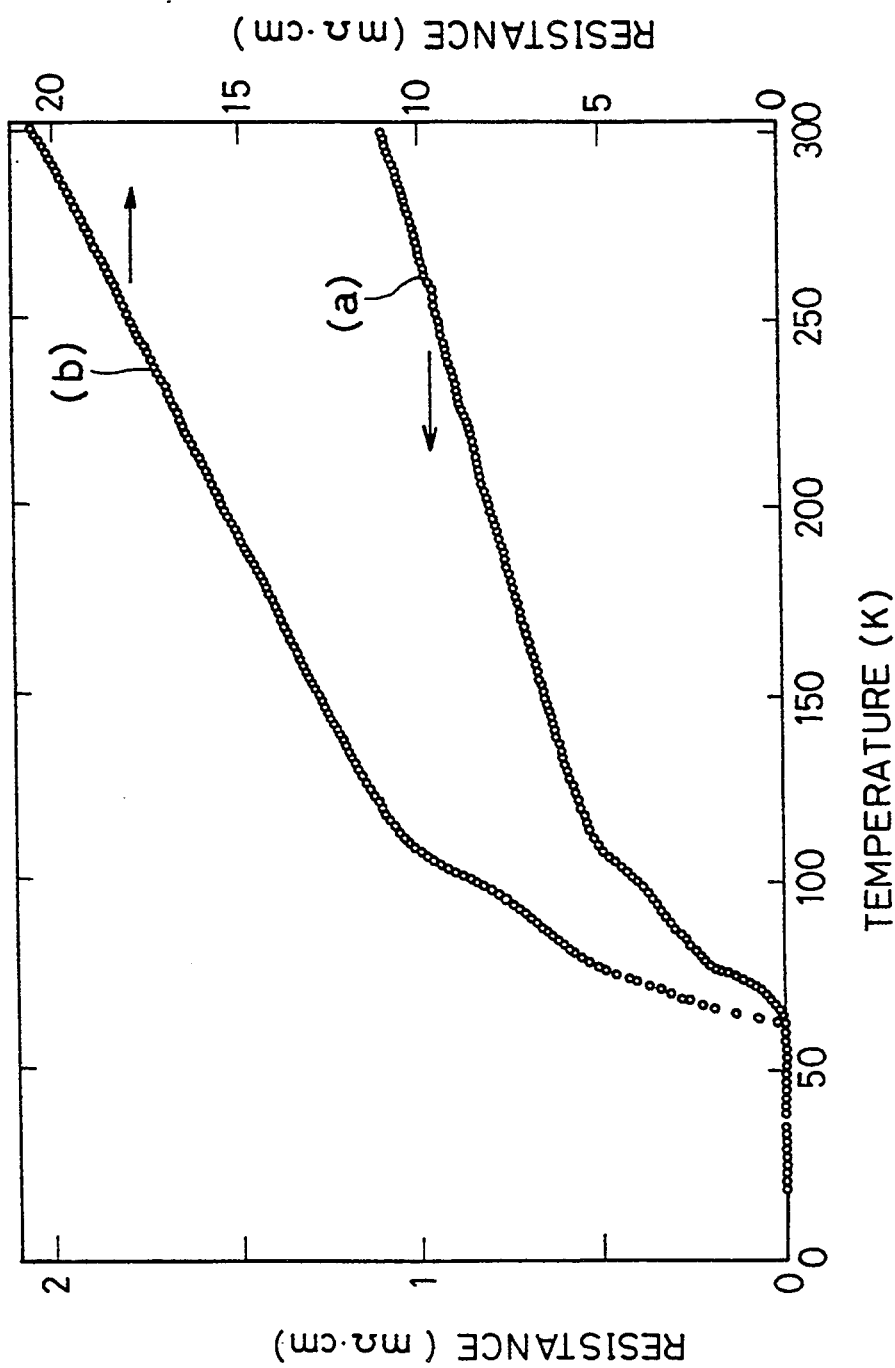
FIG. 5 is a graph illustrating resistance-temperature characteristics obtained in Example 2.
Figure 6:
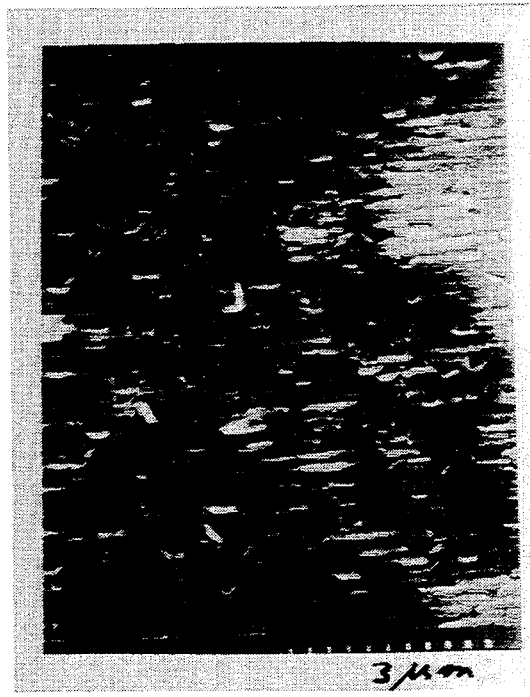
FIG. 6 is an electron microscopic photograph (30.000 ×) illustrating the crystal structure of the Bi-Sr-Ca-Cu-O system superconducting thin film obtained in Example 2.

Film was formed in the same manner as in Example 1 except for using a SrTiO$_3$ substrate having a surface inclined by about 5° in the direction from [110] to <1$\bar{1}$0>, and FIG. 4 shows XRD spectra for the resultant gi-Sr-Ca-Cu-O system superconducting thin film, FIG. 5 shows resistance - temperature characteristics and FIG. 6 shows a scanning type electron microscopic photograph, respectively.

From the result, it can be seen the followings.

That is, as shown in FIG. 4, in XRD spectra, only the peak corresponding to the face indices of (119) was observed, and the peak intensity was increased by about 7 times as compared with the thin film manufactured in the Example 1. It can be seen, as shown In the scanning electron microscopic photograph of FIG. 6, that the size of each crystal grains is increased and that the crystallization directions within the plane of the crystal grains are unified. It is considered that the surface f the SrTiO$_3$ substrate is slanted by about 5° from [110] to <1$\bar{1}$0> direction, steps at the atom level are formed in the <1$\bar{1}$0> direction at the surface of the substrate, and this may give a preferred effect on the improvement of the crystallinity.

In FIG. 5, (a) shows characteristics in a case of flowing electric current in the <100> direction, while (b) shows the characteristic in a case of flowing the electric current in the <1$\bar{1}$0> direction. Tc was 63 K in either of the directions. In addition, the anisotropy of the electric resistance in the normally conductive state was increased by 20 times, which was greater as compared with that of the Bi-Sr-Ca-Cu-O system superconducting thin film in Example 1. This is due to the improvement of the crystallinity as compared with the Bi-Sr-Ca-Cu-O system superconducting thin film in Example 1.

EXAMPLE 3

Figure 7:
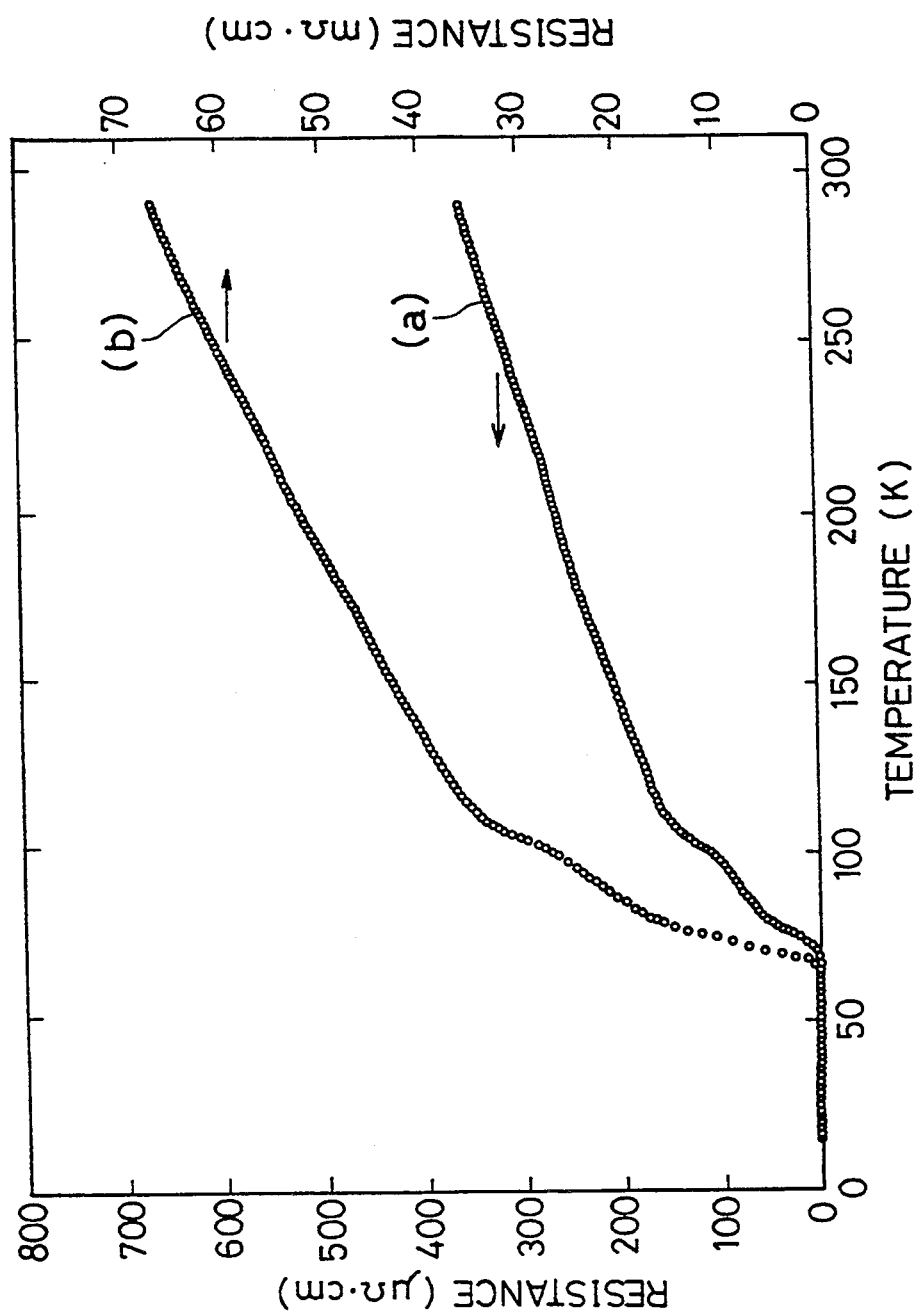
FIG. 7 is a graph illustrating resistance-temperature characteristics obtained in Example 3.

A film was formed in the same manner as in Example 1 except for preparing the film by using a SrTiO$_3$ substrate having the surface inclined by about 5° from [110] to <1$\bar{1}$0> direction at a film forming temperature of 800° C. FIG. 7 shows the resistance—temperature characteristics of the resultant Bi-Sr-Ca-Cu-O system superconducting thin film. Further, XRD spectrum and the surface shape of the thin film were the same as those of the Bi-Sr-Ca-Cu-O system superconducting thin Film in Example 2.

As shown in FIG. 7, it can be seen that the resistance —temperature characteristics of the Bi-Sr-Ca-Cu-O system superconducting thin film in this example was improved. That is, the critical temperature Tc was about 70 K in a case of flowing electric current in <100> direction ((a)), while it was about 65 K in a case of flowing the electric current <1$\bar{1}$0> direction ((b)). Further, the anisotropy of the electric resistance in the normally conductive state was about 200 times.

EXAMPLE 4

A BiSrCaCuO system superconducting film was manufactured by using the substrate and under the film-forming conditions shown in Table 4 while using the starting material gases shown in the following Table 3.

TABLE 3

| Starting material gas | Temperature and flow rate* |
| --- | --- |
| Bi(ph)$_3$ | 88° C., 50 sccm |
| Sr(DPM)$_2$ | 215° C., 50 sccm |
| Ca(DPM)$_2$ | 183° C., 50 sccm |
| Cu(DPM)$_2$ | 102° C., 50 sccm |

*Temperature and flow rate when evaporated starting material gases flow together with Ar as the carrier gas into the reactor

TABLE 4

| Oxidizing gas | O$_2$ |
| --- | --- |
| Substrate | MgO single crystal (face indices [100]) |
| Substrate temperature | 800° C. |
| Total pressure (starting gas + Ar + O$_2$) | 10 torr |
| O$_2$ partial pressure | about 6.7 torr |
| O$_2$ flow rate | 400 sccm |
| Deposition rate | about 1.5 nm/min |

As a result, a film of about 180 nm thickness could be formed by the film formation for about 2 hours. The physical properties of the resultant BiSrCaCuO system superconducting film were as shown below.

XRD spectrum : There are peaks corresponding to the face indices of (100), (200), (300) and (400). Crystal thin film oriented along the a-axis.

Chemical composition : Bi/Sr/Ca/Cu=1.0/1.0/1.1/1.8 (Sr+Ca+Cu)/Bi=3.9

Critical temperature : about 50–60 K

EXAMPLES 5–7, COMPARATIVE EXAMPLE 1–4

Figure 8:
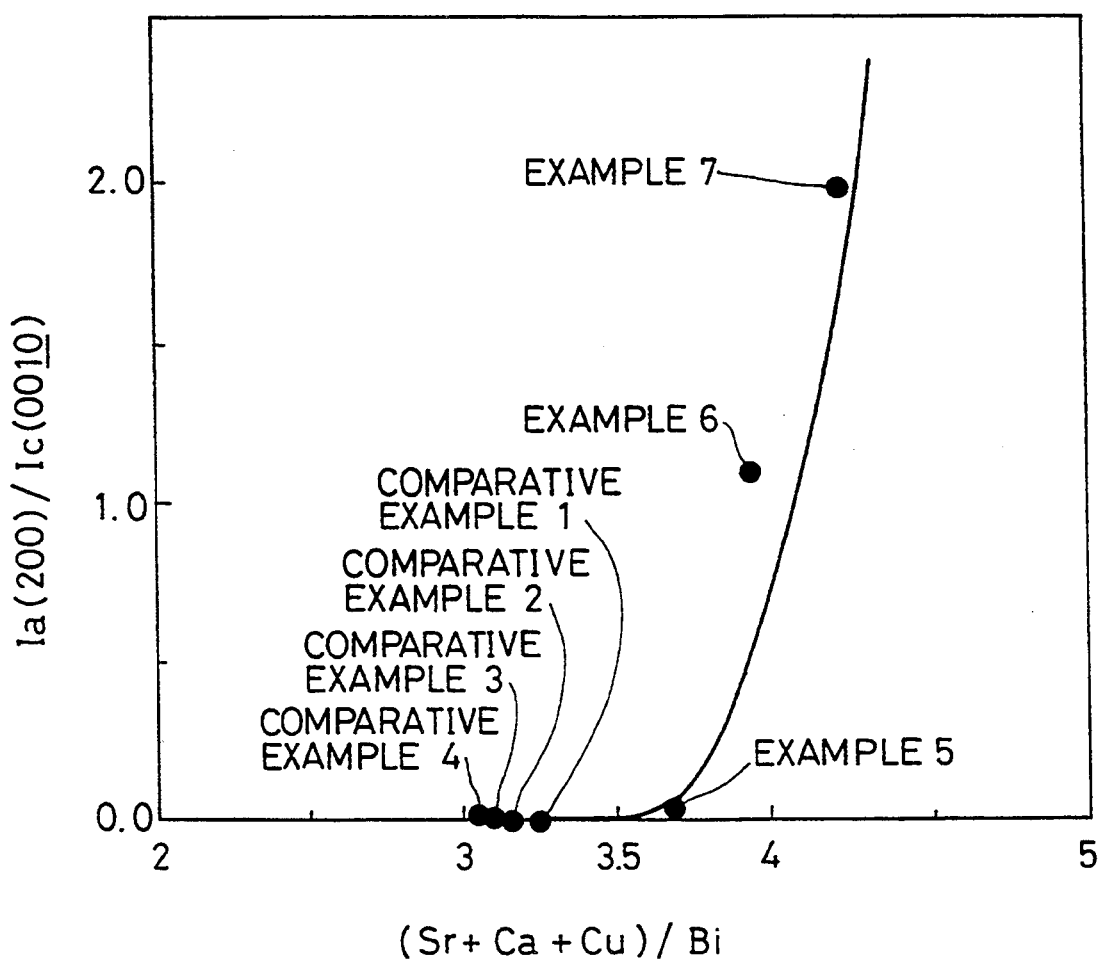
FIG. 8 is a graph illustrating a relationship between (Sr+Ca+Cu)/Bi and a-axis orientation obtained in Examples 5–7 and Comparative Examples 1–4.

Films were formed in the same manner as in Example 4 except for setting the film forming temperature at 820° C. and varying the chemical composition (Sr+Ca+Cu)/Bi of the film as shown in FIG. 8, the orientation of the resultant films was examined and the results are shown in FIG. 8.

The orientation of the film was examined based on each of the peak intensity ratio corresponding to the face indices of (200) (ingredient Ia oriented along a-axis) and (00$\overline{10}$) (ingredient Ic oriented along c-axis).

From FIG. 8, it is apparent that the BiSrCaCuO system superconducting film oriented preferentially along the a-axis was obtained by setting (Sr+Ca+Cu)/Bi$\geq$3.5.

EXAMPLE 8

A Bi-Sr-Ca-Cu-O system superconducting film was manufactured by using the starting material gases shown in the following Table 5 and using the substrate and under the film forming conditions as shown in Table 6.

TABLE 5

| Starting material gas | Temperature and flow rate* |
| --- | --- |
| Bi(ph)$_3$ | 94° C., 50 sccm |
| Sr(DPM)$_2$ | 185° C., 50 sccm |
| Ca(DPM)$_2$ | 182° C., 50 sccm |
| Cu(DPM)$_2$ | 103° C., 50 sccm |

*Temperature and flow rate when evaporated starting material gases flow together with Ar as the carrier gas into the reactor

TABLE 6

| Oxidizing gas | O$_2$ |
| --- | --- |
| Substrate | MgO single crystal (face indices [110]) |
| Substrate temperature | 800° C. |
| Total pressure (starting gas + Ar + O$_2$) | 10 torr |
| O$_2$ partial pressure | about 9 torr |
| O$_2$ flow rate | 1200 sccm |
| Deposition rate | about 0.3 nm/min |

As a result, a Film of about 500 Å thickness could be formed by the film Formation for about 3 hours. The physical properties of the resultant BiSrCaCuO system superconducting film were as shown below.

Chemical composition: Bi$_{2.0}$Sr$_2$Ca$_1$Cu$_2$O$_x$

Critical temperature (Tc) : about 60–70 K

Figure 9:
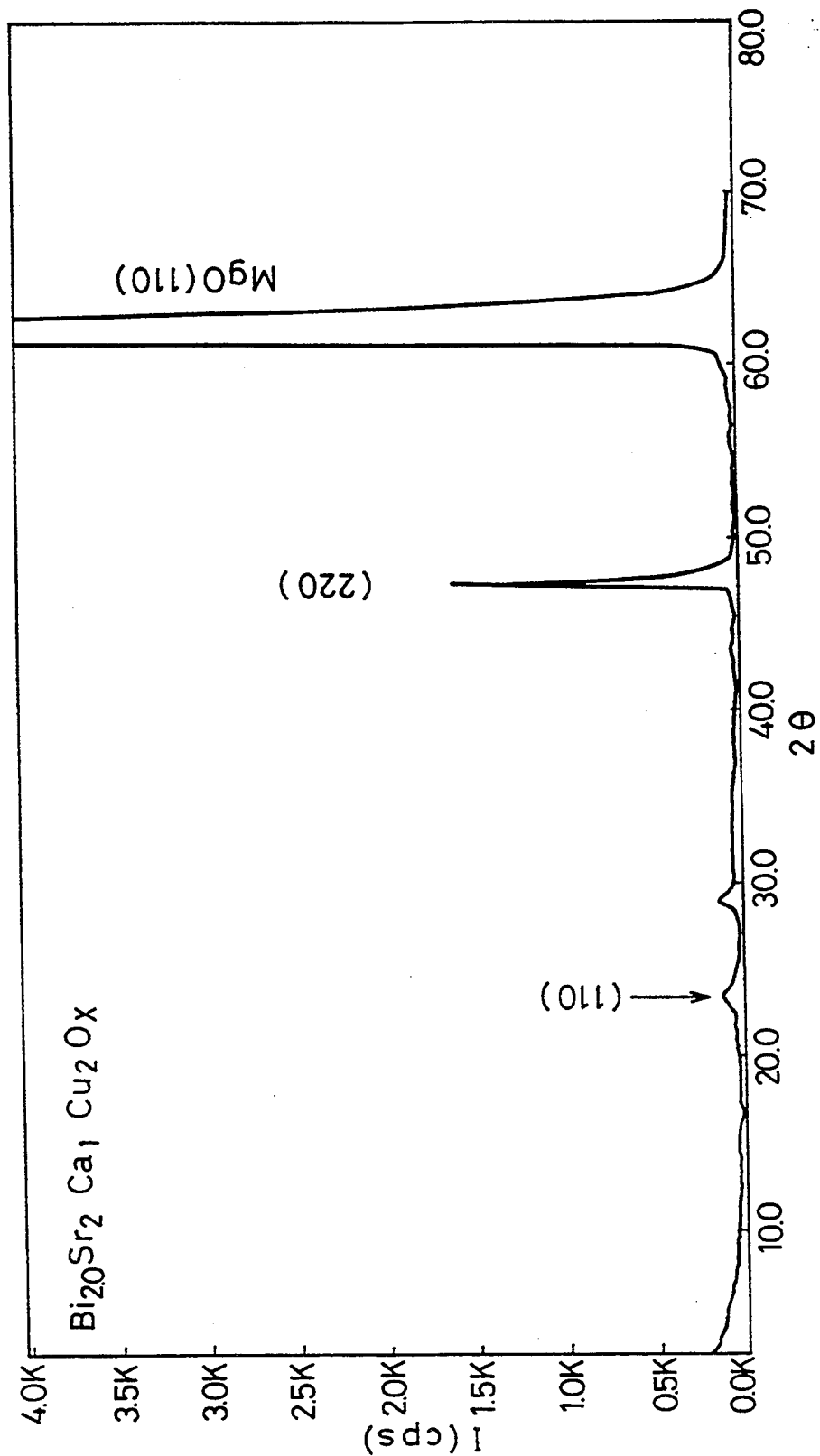
FIG. 9 is a XRD spectral diagram for a Bi-Sr-Ca-Ca-O system superconducting thin film obtained in Example 8.

XRD spectrum : shown in FIG. 9.

EXAMPLE 9

For examining the difference of the orientation degree depending on the change of the composition, films of the following compositions having the amount of Bi varied were prepared in the same manner as described above and XRD spectrum for the resultant Bi-Sr-Ca-Cu-O system superconducting films were shown in FIGS. 10–13.

Figure 10:
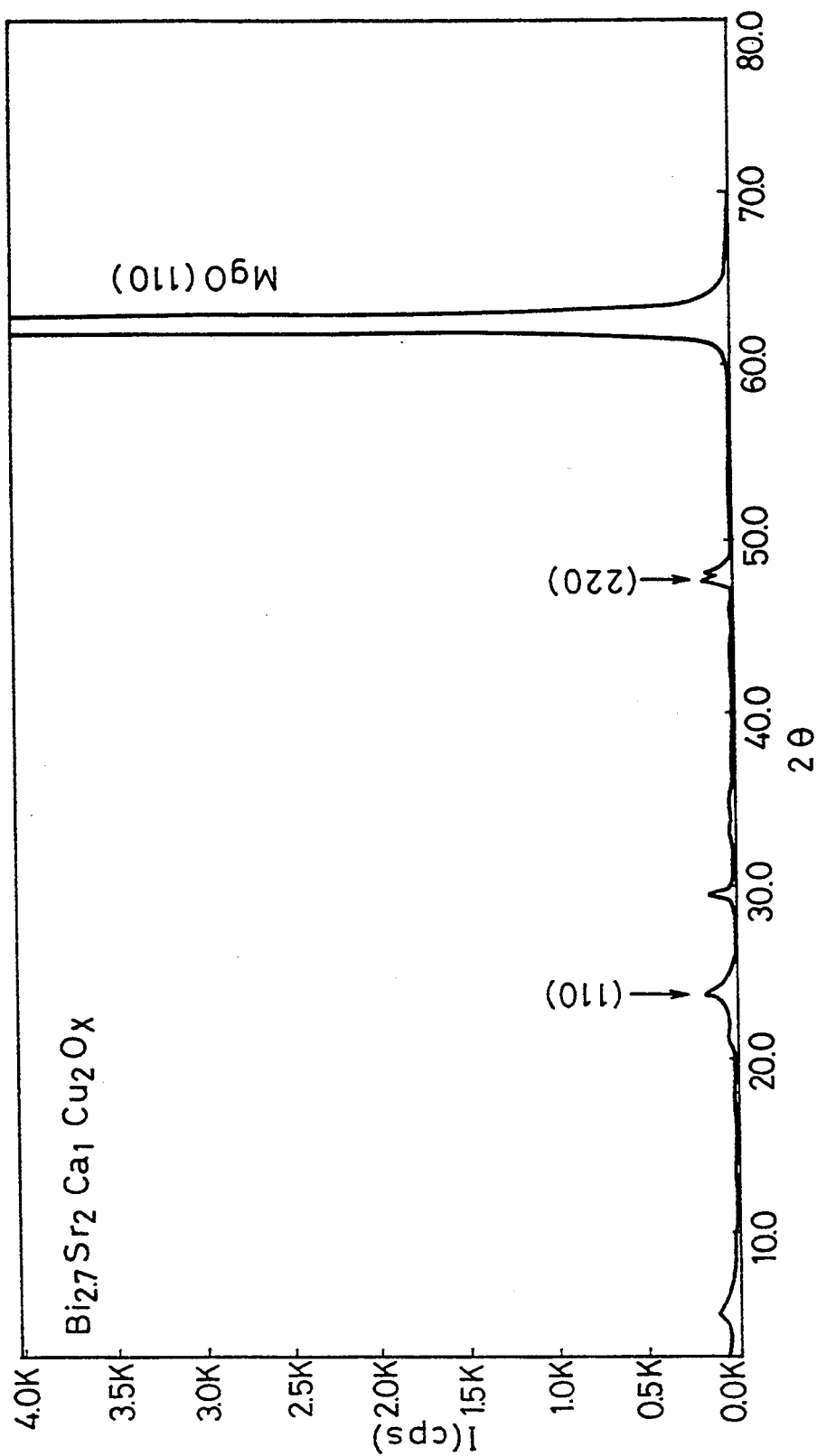
FIG. 10 is a XRD spectral diagram for a Bi-Sr-Ca-Cu-O system superconducting thin film obtained in Example 9.
Figure 11:
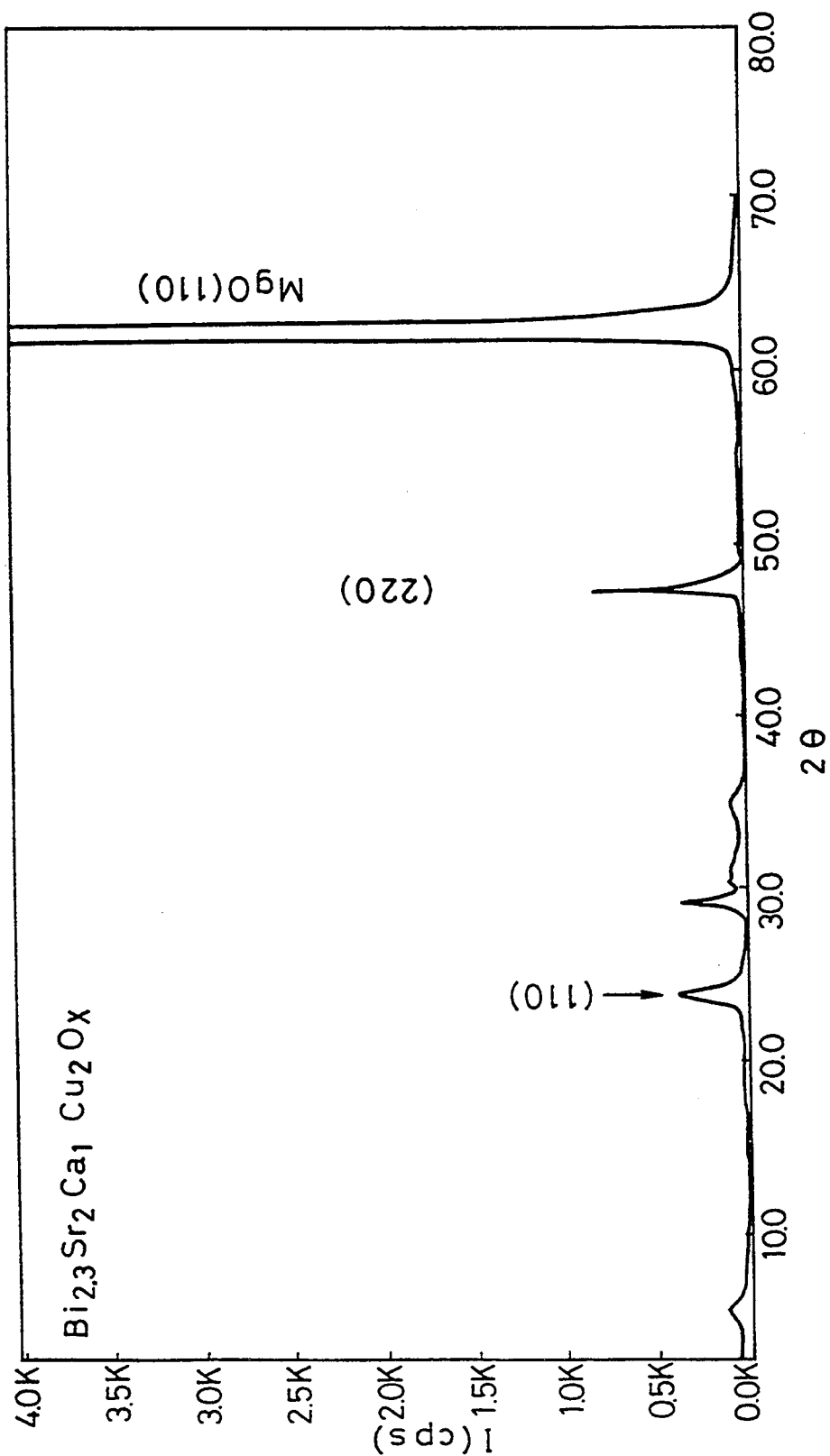
FIG. 11 is a XRD spectral diagram for a Bi-Sr-Ca-Cu-O system superconducting thin film obtained in Example 9.
Figure 12:
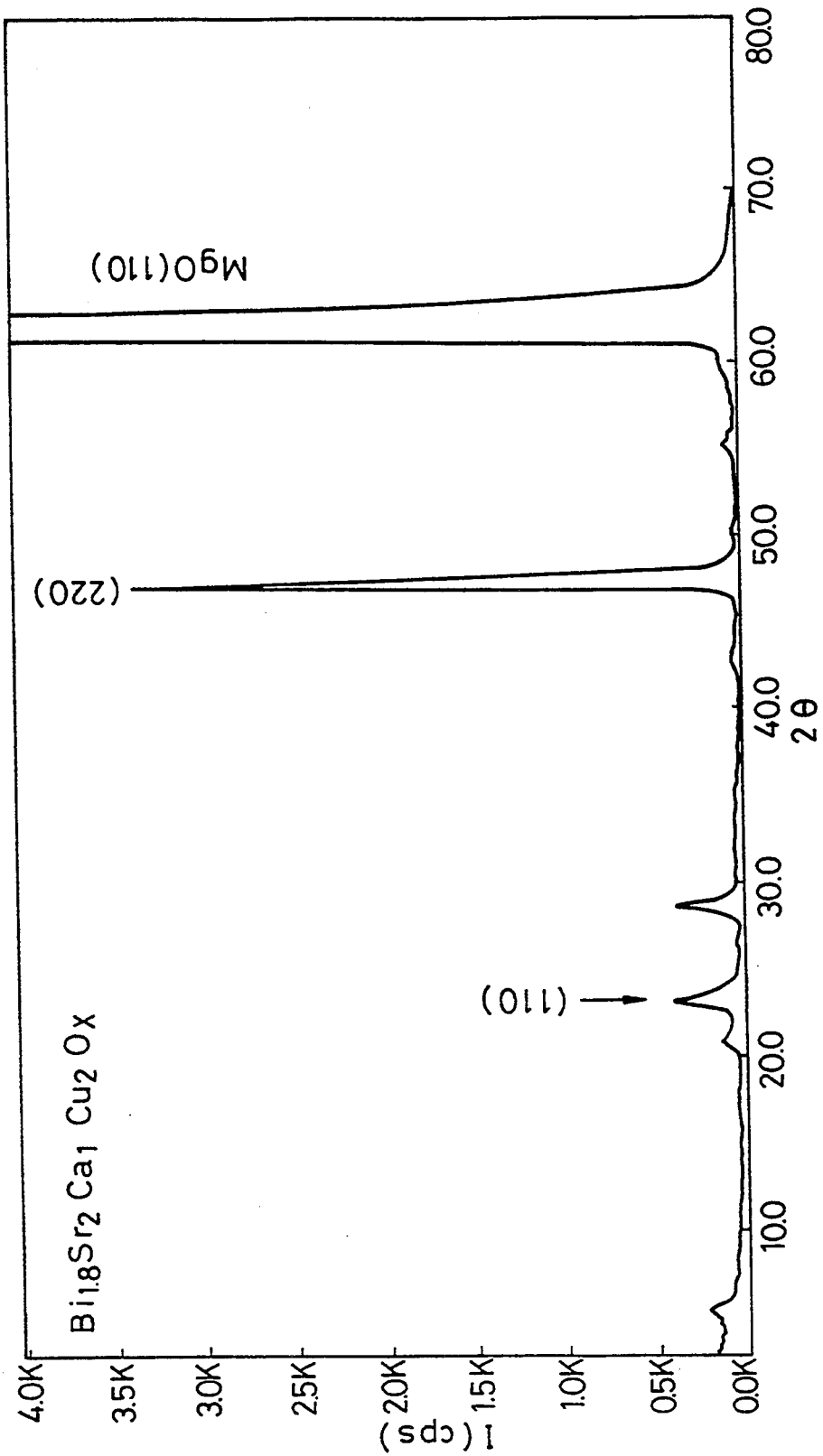
FIG. 12 is a XRD spectral diagram for a Bi-Sr-Ca-Cu-O system superconducting thin film obtained in Example 9.
Figure 13:
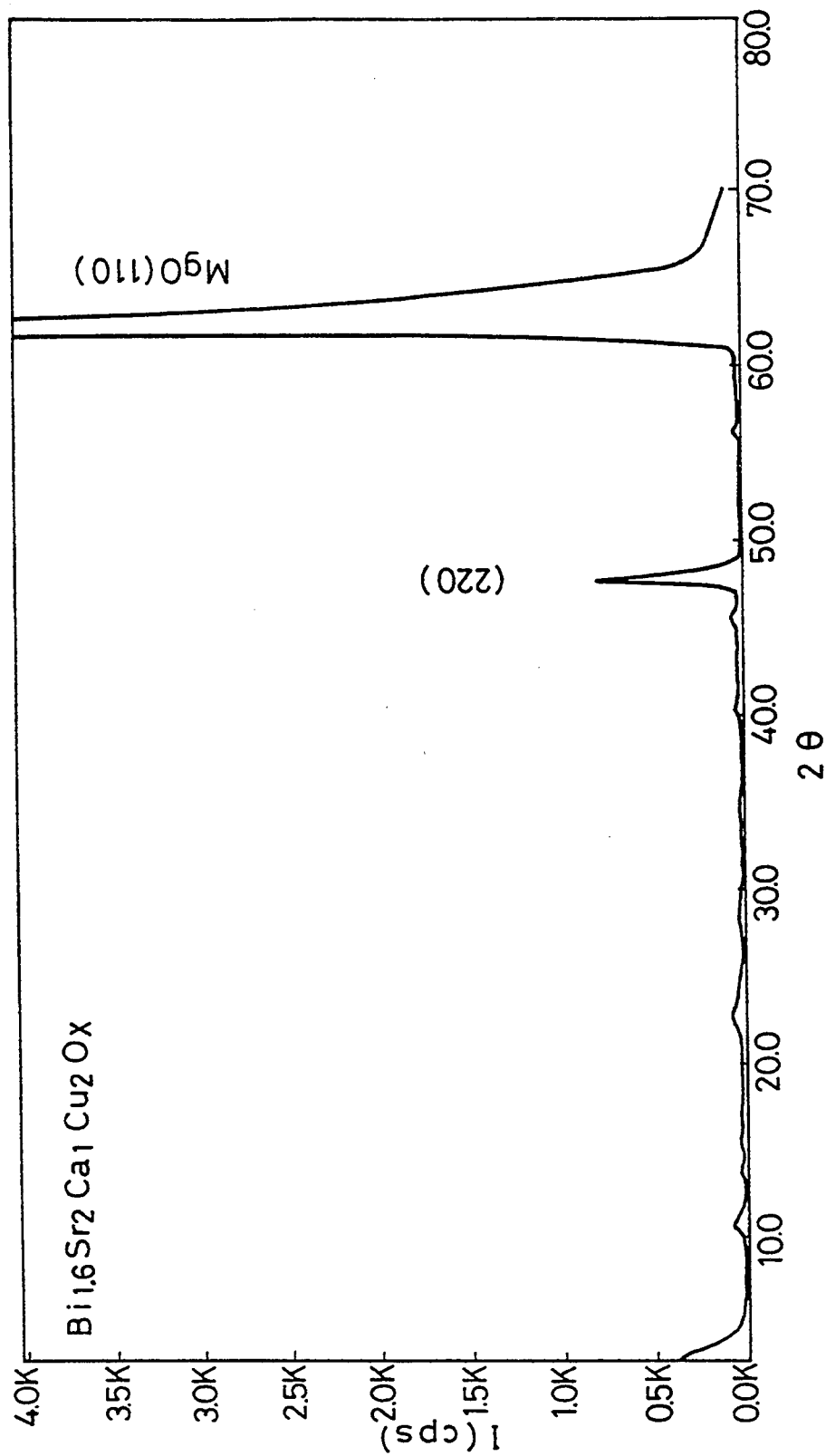
FIG. 13 is a XRD spectral diagram for a Bi-Sr-Ca-Cu-O system superconducting thin film obtained in Example 9.

| Chemical Composition | XRD Spectrum |
| --- | --- |
| Bi$_{2.7}$Sr$_2$Ca$_1$Cu$_2$O$_x$ | Shown in FIG. 10 |
| Bi$_{2.3}$Sr$_2$Ca$_1$Cu$_2$O$_x$ | Shown in FIG. 11 |
| Bi$_{1.8}$Sr$_2$Ca$_1$Cu$_2$O$_x$ | Shown in FIG. 12 |
| Bi$_{1.6}$Sr$_2$Ca$_1$Cu$_2$O$_x$ | Shown in FIG. 13 |

As apparent from FIG. 9 showing the XRD spectrum for the film having the chemical composition of Bi$_{2.0}$Sr$_2$Ca$_1$Cu$_2$O$_x$ (2212), a peak for the MgO [110] single crystals as the substrate and the peak corresponding to the face indices of (110), (220) appear intensely. In particular, the peak corresponding to the face indices (220) appears at a rather strong intensity. From the result, it can be recognized that the resultant Bi-Sr-Ca-Cu-O system superconducting thin film is oriented intensely (110).

Further, FIGS. 10 and 11 show XRD spectrum in a case of increasing only Bi from the (2212) composition. As can be seen from FIG. 10, if Bi is increased from 2 to 2.7, intense (110) orientation was no more shown. On the contrary, as can be seen from FIG. 12 among FIGS. 12 and 13 illustrating the XRD spectrum in a case of decreasing the amount of Bi, (220) peak appears more intensely in a case of slightly decreasing Bi from 2 to 1.8 than in the case of the (2212) composition. However, if Bi is decreased further, the (220) peak intensity is reduced again as seen in FIG. 13. From the above, it is recognized that the (110) orientation degree is intensified by slightly decreasing the amount of Bi from the stoichiometrical composition.

EXAMPLE 10

For examining the effect of nuclei formation on the (110) orientation degree in the initial stage of the film formation by the CVD process, quarternary thin films of St, Ca, Cu and 0 excluding Bi were formed to average film thickness of 5, 15 and 30 Å respectively in the initial stage of film formation in Example 9, on which a Bi-Sr-Cu-O film was formed to 500 in the same manner as in Example 9. The XRD spectrum of the resultant Bi-Sr-Ca-Cu-O system superconducting thin film is shown in FIG. 14 and SEM photograph thereof is shown in FIG. 15.

Figure 14:
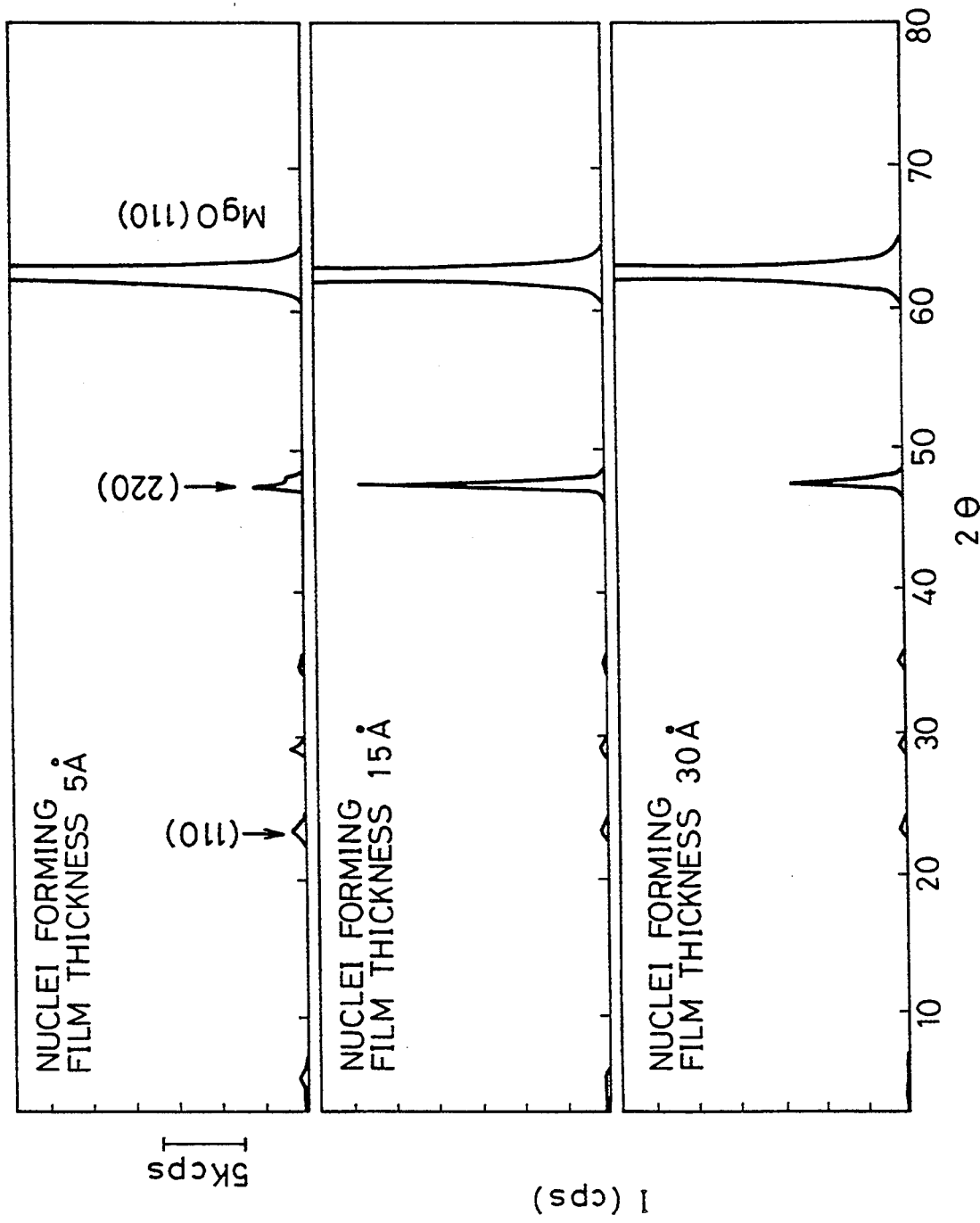
FIG. 14 is a XRD spectral diagram for a Bi-Sr-Ca-Cu-O system superconducting thin film obtained in Example 10.

As apparent from FIG. 14, the film put to nuclear formation to 15 Å thickness in the initial stage of film formation has best (110) orientation degree.

Figure 15C:
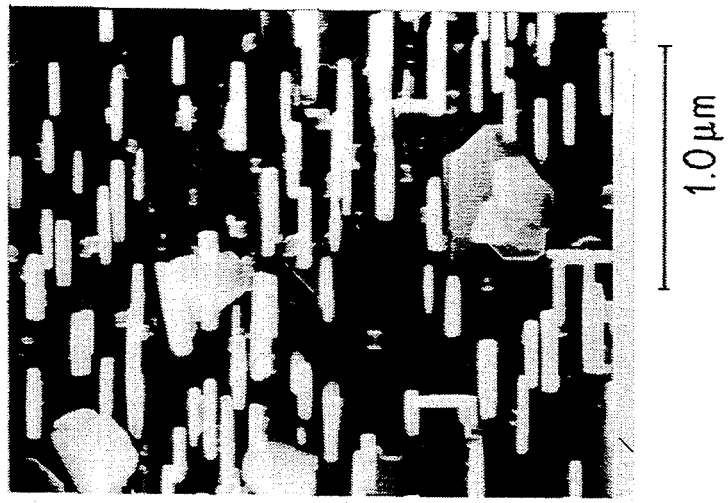
FIG. 15 is a SEM photograph illustrating the crystal structure of a Bi-Sr-Ca-Cu-O system superconducting thin film obtained in Example 10.
Figure 15B:
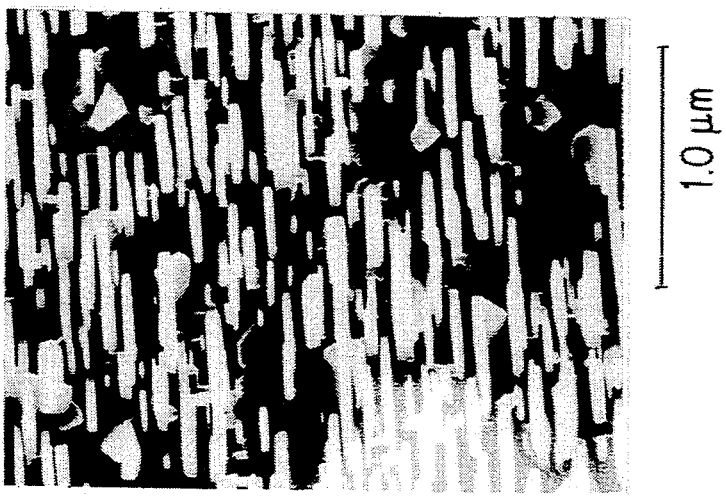
Figure 15A:
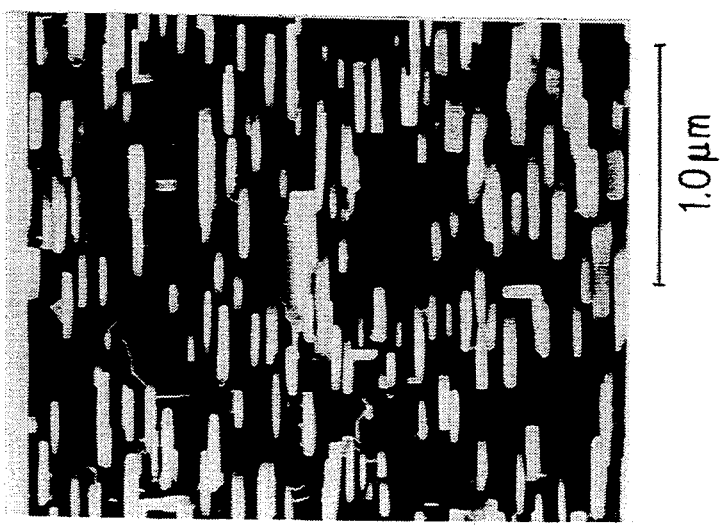

Further, portions viewed as white rectangular shape in SEM photograph of FIG. 15 are those portions causing (110) orientation. Although they have not yet cover the entire surface of the film, the effect of the nuclei formation at the initial stage can also be confirmed in the same manner as the result of the XRD spectrum and the film causing nuclei formation to 15 Å thickness shows the greatest ingredient for (110) orientation.

EXAMPLE 11

Then, after forming the nuclei to the thickness of 15 Å, the film was formed at a composition with the reduced amount of Bi in the Bi-Sr-Ca-Cu-O system superconducting thin film, to examine the effect obtained by the combination of the nuclei formation and the control for the amount of Bi and, further, the relationship with the film thickness.

Figure 16:
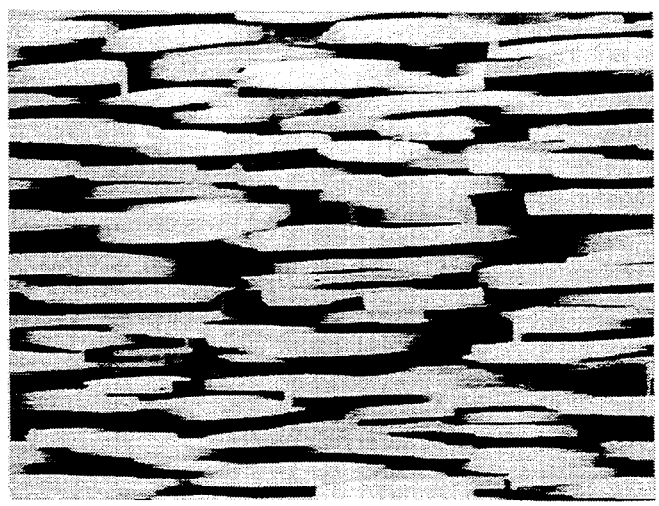
FIG. 16 is a SEM photograph illustrating the crystal structure of a Bi-Sr-Ca-Cu-O system superconducting thin film obtained in Example 11.

That is, in Example 10, after forming a quaternary thin film comprising Sr, Ca, Cu and O to an average film thickness of 15 Å in the initial stage of film formation, a Bi-Sr-Ca-Cu-O system superconducting thin film of a composition ($Bi_{1.8}Sr_2Ca_1Cu_2O_x$) with the reduced amount of Bi was formed to a thickness of 3000 Å. FIG. 16 shows the SEM photograph of the resultant Bi-Sr-Ca-Cu-O system superconducting thin film.

Comparing FIG. 16 and FIG. 15, it can be seen that (110) orientation ingredients covers the entire film in the Bi-Sr-Ca-Cu-O system superconducting thin film in this embodiment.

As has been described above, it is most suitable to (110) orientation, to form nuclei in the initial stage of film formation and, subsequently, to prepare a Bi-Sr-Ca-Cu-O system superconducting thin film of a composition with a slightly reduced amount of Bi.

What is claimed is:

1. A Bi-Sr-Ca-Cu-O system superconducting thin film formed on a substrate comprising (110) single crystals of an $ABO_3$ oxide having a perovskite structure and selected from the group consisting of $SrTiO_3$, $NdGaO_3$, $LaAlO_3$ and $YAlO_3$, in which a (119) face is selectively grown relative to a substrate surface, said substrate surface being inclined by 2° to 10° in a $<1\bar{1}0>$ direction relative to (110).

2. A Bi-Sr-Ca-Cu-O system superconducting thin film formed by a chemical vapor deposition process on a substrate comprising MgO [110] single crystals, wherein (110) face is selectively grown to the substrate surface.

3. A Bi-Sr-Ca-Cu-O system superconducting thin film according to claim 1, wherein said thin film has a thickness of 10–1000 nm and critical temperature of 50–100K.

4. A Bi-Sr-Ca-Cu-O system superconducting thin film according to claim 2, wherein said thin film has a thickness of 100–10000 Å and critical temperature of 50–100K.

* * * * *